(12) United States Patent
Tu

(10) Patent No.: US 12,224,022 B2
(45) Date of Patent: Feb. 11, 2025

(54) FUSE BLOCK UNIT AND FUSE BLOCK SYSTEM AND MEMORY DEVICE

(71) Applicant: Winbond Electronics Corp., Taichung (TW)

(72) Inventor: Tsung-I Tu, Tainan (TW)

(73) Assignee: WINDBOND ELECTRONICS CORP., Taichung (TW)

( * ) Notice: Subject to any disclaimer, the term of this patent is extended or adjusted under 35 U.S.C. 154(b) by 162 days.

(21) Appl. No.: 18/191,986

(22) Filed: Mar. 29, 2023

(65) Prior Publication Data

US 2023/0335206 A1    Oct. 19, 2023

(30) Foreign Application Priority Data

Apr. 19, 2022   (TW) .................................. 111114783

(51) Int. Cl.
*G11C 17/14*           (2006.01)
(52) U.S. Cl.
CPC ................... *G11C 17/143* (2013.01)
(58) Field of Classification Search
CPC ......... G11C 17/143; G11C 17/18; G11C 5/14; G11C 7/106; G11C 29/36
USPC .......................................................... 365/96
See application file for complete search history.

(56) References Cited

U.S. PATENT DOCUMENTS

| | | | |
|---|---|---|---|
| 7,460,421 B2 | 12/2008 | Kohara | |
| 7,567,115 B2* | 7/2009 | Huang | G11C 17/16 327/525 |
| 10,395,726 B2 | 8/2019 | Tu | |
| 2011/0291744 A1* | 12/2011 | Kim | G11C 17/18 327/525 |
| 2015/0380104 A1* | 12/2015 | Park | G11C 17/16 365/96 |
| 2017/0352432 A1* | 12/2017 | Tu | G06F 1/32 |

* cited by examiner

*Primary Examiner* — Huan Hoang
*Assistant Examiner* — Minh Dinh
(74) *Attorney, Agent, or Firm* — Birch, Stewart, Kolasch & Birch, LLP

(57) ABSTRACT

A fuse block unit includes a share flip-flop. The share flip-flop includes a first switch element, a second switch element, a third switch element, a fourth switch element, a first latch, and a second latch. The first switch element selectively couples a first laser latch to a first node according to the first load voltage. The second switch element selectively couples a second laser latch to the first node according to the second load voltage. The third switch element selectively couples an input node to the first node according to the inverted shift voltage. The first latch is coupled between the first node and a second node. The fourth switch element selectively couples the second node to a third node according to the shift voltage. The second latch is coupled between the third node and an output node.

20 Claims, 8 Drawing Sheets

FUSE BLOCK UNIT AND FUSE BLOCK SYSTEM AND MEMORY DEVICE

CROSS REFERENCE TO RELATED APPLICATIONS

This application claims priority of Taiwan Patent Application No. 111114783 filed on Apr. 19, 2022, the entirety of which is incorporated by reference herein.

BACKGROUND OF THE INVENTION

Field of the Invention

The disclosure generally relates to a fuse block unit, and more specifically, to a fuse block unit and a memory device thereof.

Description of the Related Art

In a conventional design, fuse block units are distributed throughout a chip. As a result, the dispersed fuse block units cause a waste of chip area because circuits and traces must be arranged to avoid the area occupied by the dispersed fuse block units, and increasing the testing costs because the product testing process should be performed many times. Accordingly, there is a need to propose a novel solution for solving the problems of the prior art.

BRIEF SUMMARY OF THE INVENTION

The invention proposes a fuse block unit that includes a first laser fuse, a second laser fuse, a first laser latch, a second laser latch, and a share flip-flop. The first laser fuse outputs first data. The first laser latch is coupled to the first laser fuse. The second laser fuse outputs second data. The second laser latch is coupled to the second laser fuse. The share flip-flop includes a first switch element, a second switch element, a third switch element, a fourth switch element, a first latch, and a second latch. The first switch element selectively couples the first laser latch to a first node according to the first load voltage. The second switch element selectively couples the second laser latch to the first node according to the second load voltage. The high logic pulses of the second load voltage do not occur simultaneously with those of the first load voltage. The third switch element selectively couples an input node to the first node according to the inverted shift voltage. The first latch is coupled between the first node and a second node. The fourth switch element selectively couples the second node to a third node according to the shift voltage. The second latch is coupled between the third node and an output node.

The invention proposes a fuse block system that includes a plurality of fuse block units as mentioned above. A plurality of share flip-flops of the fuse block units are coupled in series.

The invention proposes a memory device that includes a plurality of fuse block units as mentioned above, a pipeline pulse generator, and an oscillator. The fuse block units are coupled in series. The fuse block units are operated according to the first load voltage, the second load voltage, and the shift voltage, so as to generate final output data at the output node. The pipeline pulse generator generates the first load voltage and the second load voltage. The oscillator generates the shift voltage.

According to the fuse block unit, the fuse block system, and the memory device of the invention, the efficiency of the space used in the chip can be improved, the number of traces can be reduced, the testing time can be shortened, and the manufacturing cost can be decreased.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. Also, the term "couple" is intended to mean either an indirect or direct electrical connection. Accordingly, if one device is coupled to another device, that connection may be through a direct electrical connection, or through an indirect electrical connection via other devices and connections.

Figure 1:
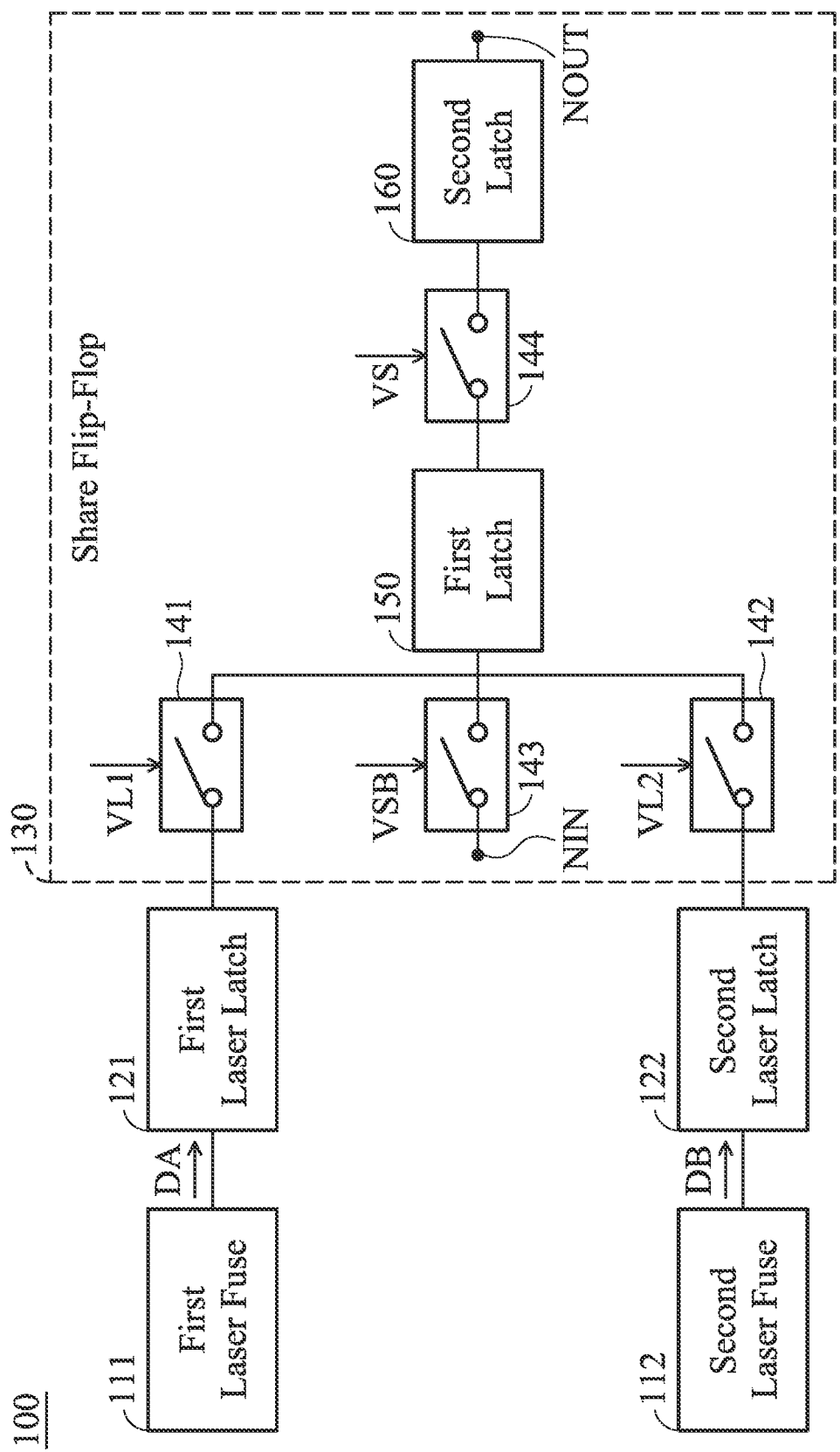
FIG. 1 is a diagram of a fuse block unit according to an embodiment of the invention.

As shown in FIG. 1, a fuse block unit 100 includes a first laser fuse 111, a second laser fuse 112, a first laser latch 121, a second laser latch 122, and a share flip-flop 130 according to an embodiment of the invention. For example, the fuse block unit 100 may be applied in a memory device, but the invention is not limited thereto.

The first laser latch 121 is coupled to the first laser fuse 111, and is configured to receive and store first data DA from the first laser fuse 111. The second laser latch 122 is coupled to the second laser fuse 112, and is configured to receive and store second data DB from the second laser fuse 112. In some embodiments, if any fuse is turned on, it will represent the corresponding data at a high logic level (e.g., a logic "1"), and if any fuse is burned out, it will represent the corresponding data at a low logic level (e.g., a logic "0"). However, the invention is not limited to the above.

The share flip-flop 130 with an input node NIN and an output node NOUT includes a first switch element 141, a second switch element 142, a third switch element 143, a fourth switch element 144, a first latch 150, and a second latch 160. Each switch element is independently controlled, so as to operate in a closed state or an open state. In some embodiments, each of the first switch element 141, the second switch element 142, the third switch element 143, and the fourth switch element 144 is implemented with a transmission gate, but the invention is not limited thereto.

The first switch element 141 selectively couples the first laser latch 121 to the first latch 150 according to the first load voltage VL1. For example, if the first load voltage VL1 has a high logic level, the first switch element 141 may be closed, and the first laser latch 121 may be coupled to the first latch 150. Conversely, if the first load voltage VL1 has a low logic level, the first switch element 141 may be opened, and the first laser latch 121 may be decoupled from the first latch 150.

The second switch element 142 selectively couples the second laser latch 122 to the first latch 150 according to the second load voltage VL2. For example, if the second load voltage VL2 has a high logic level, the second switch element 142 may be closed, and the second laser latch 122 may be coupled to the first latch 150. Conversely, if the second load voltage VL2 has a low logic level, the second switch element 142 may be opened, and the second laser latch 122 may be decoupled from the first latch 150.

It should be noted that the first load voltage VL1 and the second load voltage VL2 are switched to high logic levels at different times. That is, it is impossible that both the first laser latch 121 and the second laser latch 122 are coupled to the first latch 150 concurrently.

The third switch element 143 selectively couples an input node NIN to the first latch 150 according to the inverted shift voltage VSB. For example, if the inverted shift voltage VSB has a high logic level, the third switch element 143 may be closed, and the input node NIN may be coupled to the first latch 150. Conversely, if the inverted shift voltage VSB has a low logic level, the third switch element 143 may be opened, and the input node NIN may be decoupled from the first latch 150.

The fourth switch element 144 selectively couples the first latch 150 to the second latch 160 according to the shift voltage VS. The shift voltage VS and the inverted shift voltage VSB may have complementary logic levels. For example, if the shift voltage VS has a high logic level, the fourth switch element 144 may be closed, and the first latch 150 may be coupled to the second latch 160. Conversely, if the shift voltage VS has a low logic level, the fourth switch element 144 may be opened, and the first latch 150 may be decoupled from the second latch 160. The second latch 160 is coupled between the third node N3 and an output node NOUT.

According to this embodiment, since the share flip-flop 130 receives either the first data DA from the first laser fuse 111 or the second data DB from the second laser fuse 112, the first laser latch 121 and the second laser latch 122 can use the same share flip-flop 130 for data transmission. Thus, the number of flip-flops required by the fuse block unit 100 is reduced. In addition, either the first data DA or the second data DB can be temporarily stored in the first latch 150 and the second latch 160, and they can communicate with other shape flip-flops 130 through the input node NIN and the output node NOUT. As a result, the proposed fuse block unit 100 of the invention not only reduces the complexity of circuitry but also lowers overall manufacturing costs.

The following embodiments will introduce a variety of configurations and applications of the fuse block unit 100. It should be understood that these figures and descriptions are merely exemplary, rather than limitations of the invention.

Figure 2:
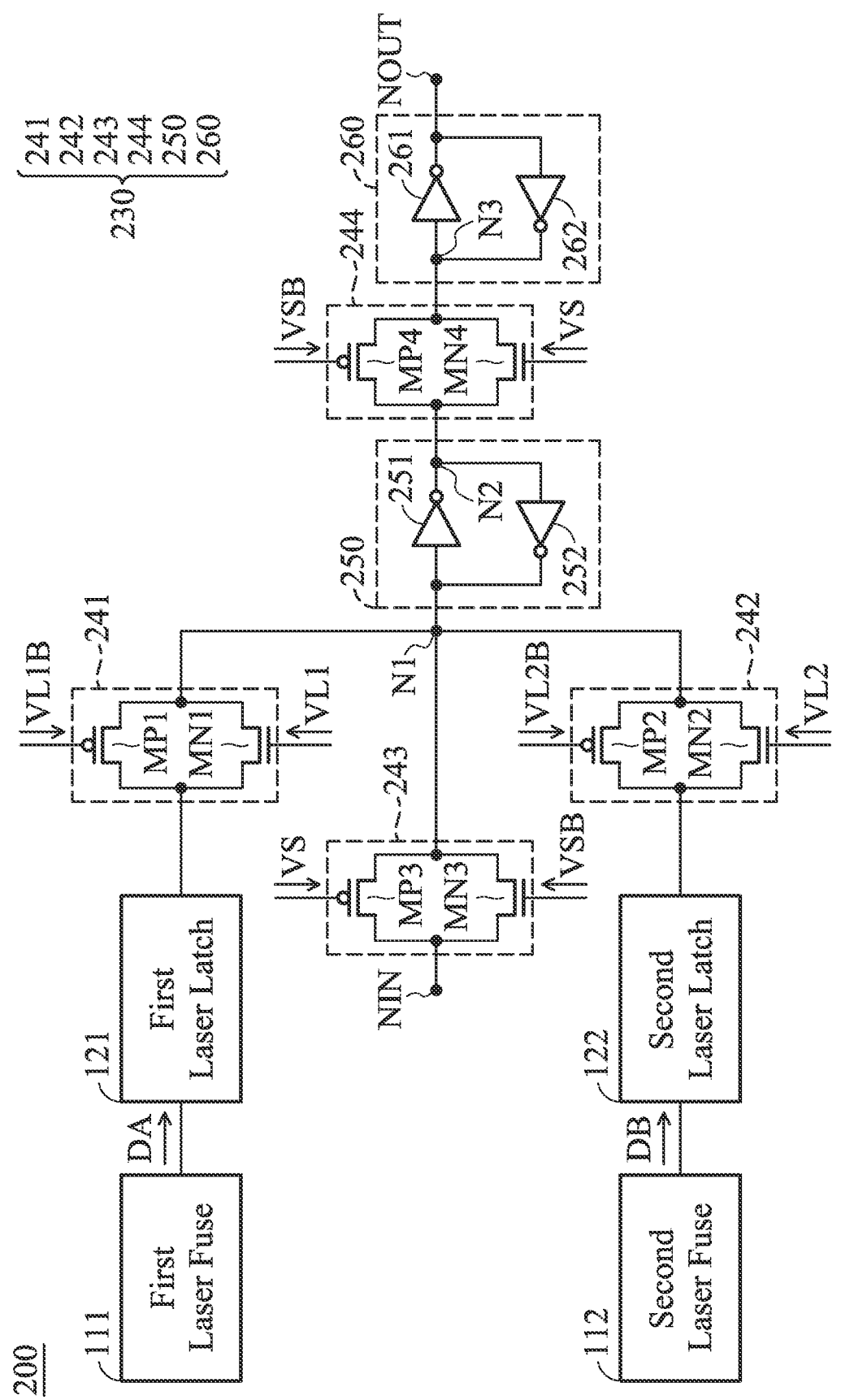
FIG. 2 is a diagram of a fuse block unit according to an embodiment of the invention.

FIG. 2 is a diagram of a configuration of a share flip-flop 230 of a fuse block unit 200 according to an embodiment of the invention. In the embodiment of FIG. 2, the portions which are similar to FIG. 1 will not be illustrated again herein. The share flip-flop 230 includes a first switch element 241, a second switch element 242, a third switch element 243, a fourth switch element 244, a first latch 250, and a second latch 260. In this embodiment, the outputs of the first switch element 241, the second switch element 242, and the third switch element 243 are coupled to the input of the first latch 250 through a first node N1. The output of the first latch 250 is coupled to the input of the fourth switch element 244 through a second node N2. The output of the fourth switch element 244 is coupled to the input of the second latch 260 through a third node N3.

Specifically, the first switch element 241 includes a first N-type transistor MN1 and a first P-type transistor MP1. The first N-type transistor MN1 has a control terminal for receiving the first load voltage VL1, a first terminal coupled to the first laser latch 121, and a second terminal coupled to the first node N1. The first P-type transistor MP1 has a control terminal for receiving an inverted first load voltage VL1B, a first terminal coupled to the first laser latch 121, and a second terminal coupled to the first node N1. The first load voltage VL1 and the inverted first load voltage VL1B may have complementary logic levels.

The second switch element 242 includes a second N-type transistor MN2 and a second P-type transistor MP2. The second N-type transistor MN2 has a control terminal for receiving the second load voltage VL2, a first terminal coupled to the second laser latch 122, and a second terminal coupled to the first node N1. The second P-type transistor MP2 has a control terminal for receiving an inverted second load voltage VL2B, a first terminal coupled to the second laser latch 122, and a second terminal coupled to the first node N1. The second load voltage VL2 and the inverted second load voltage VL2B may have complementary logic levels.

The third switch element 243 includes a third N-type transistor MN3 and a third P-type transistor MP3. The third N-type transistor MN3 has a control terminal for receiving the inverted shift voltage VSB, a first terminal coupled to the input node NIN, and a second terminal coupled to the first node N1. The third P-type transistor MP3 has a control terminal for receiving the shift voltage VS, a first terminal coupled to the input node NIN, and a second terminal coupled to the first node N1.

The first latch 250 includes a first inverter 251 and a second inverter 252. The first inverter 251 has an input terminal coupled to the first node N1, and an output terminal coupled to the second node N2. The second inverter 252 has an input terminal coupled to the second node N2, and an output terminal coupled to the first node N1.

The fourth switch element 244 includes a fourth N-type transistor MN4 and a fourth P-type transistor MP4. The fourth N-type transistor MN4 has a control terminal for receiving the shift voltage VS, a first terminal coupled to the second node N2, and a second terminal coupled to the third node N3. The fourth P-type transistor MP4 has a control terminal for receiving the inverted shift voltage VSB, a first terminal coupled to the second node N2, and a second terminal coupled to the third node N3.

The second latch 260 includes a third inverter 261 and a fourth inverter 262. The third inverter 261 has an input terminal coupled to the third node N3, and an output terminal coupled to the output node NOUT. The fourth inverter 262 has an input terminal coupled to the output node NOUT, and an output terminal coupled to the third node N3.

In some embodiments, each N-type transistor is an NMOS transistor (N-type Metal Oxide Semiconductor Field Effect Transistor or NMOSFET), and each P-type transistor is a PMOS transistor (P-type Metal Oxide Semiconductor Field Effect Transistor or PMOSFET), but they are not limited thereto.

Figure 3:
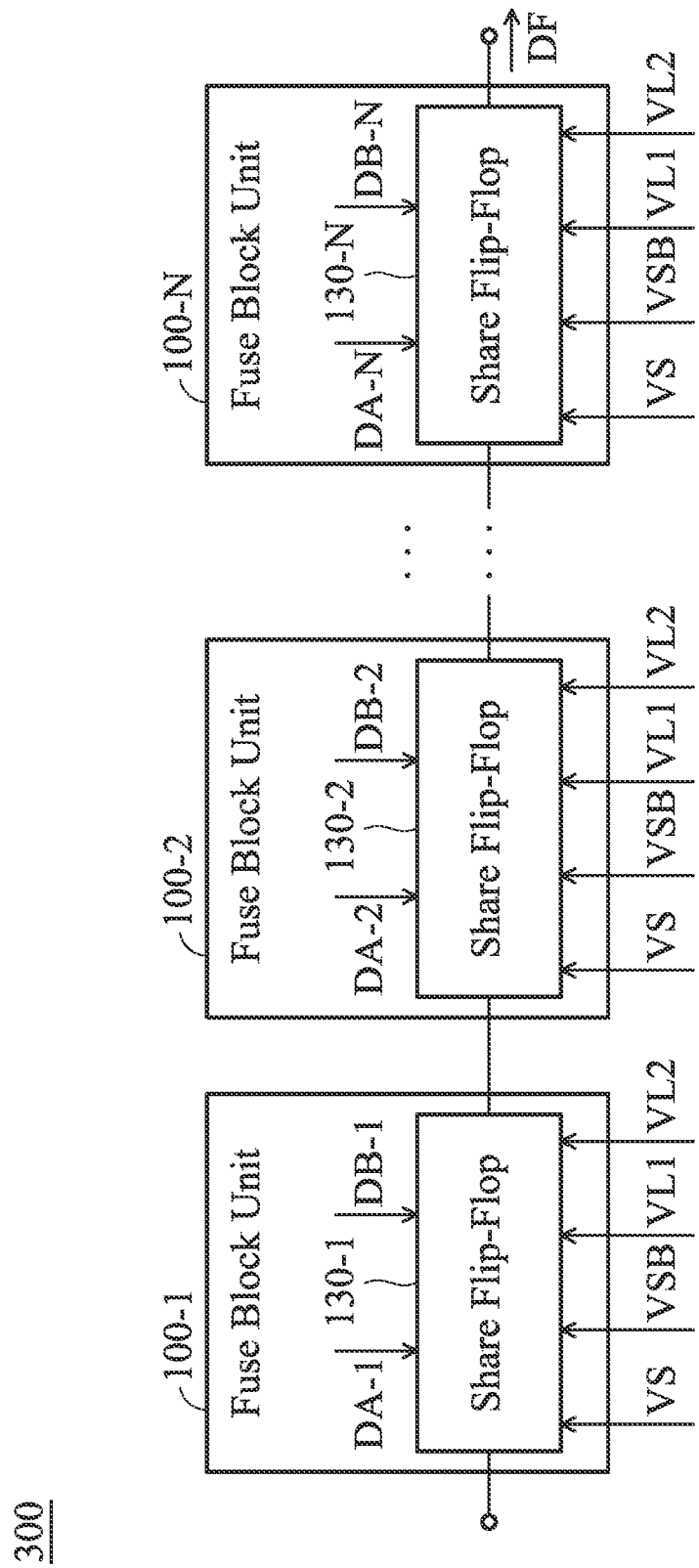
FIG. 3 is a diagram of a fuse block system according to an embodiment of the invention.

In the embodiment of FIG. 3, a fuse block system 300 includes a plurality of fuse block units 100-1, 100-2, . . . , and 100-N (e.g., N may be a positive integer which is greater than or equal to 2), whose circuit structures have been described in the embodiments of FIG. 1 and FIG. 2. A plurality of share flip-flops 130-1, 130-2, . . . , and 130-N of the fuse block units 100-1, 100-2, . . . , and 100-N are coupled in series. For example, the input node NIN of the share flip-flop 130-2 may be coupled to the output node NOUT of the previous share flip-flop 130-1, and so on. Thus, the size of the fuse block system 300 can be minimized.

In some embodiments, the share flip-flops 130-1, 130-2, . . . , and 130-N have the functions of parallel inputs. In other words, the share flip-flops 130-1, 130-2, . . . , and 130-N can receive data simultaneously. That is, at the same time, the share flip-flop 130-1 receives either first data DA-1 or second data DB-1, the share flip-flop 130-2 receives either first data DA-2 or second data DB-2, . . . , and the share flip-flop 130-N receives either first data DA-N or second data DB-N. In some embodiments, the share flip-flops 130-1, 130-2, . . . , and 130-N have the functions of sequential outputs. That is, a plurality of data stored in the share flip-flops 130-1, 130-2, . . . , and 130-N can be sequentially output according to the shift voltage VS and the inverted shift voltage VSB, so as to form final output data DF. Other features of the fuse block system 300 of FIG. 3 are similar to those of the fuse block unit 100 of FIG. 1. Therefore, the two embodiments can achieve similar levels of performance.

Figure 4:
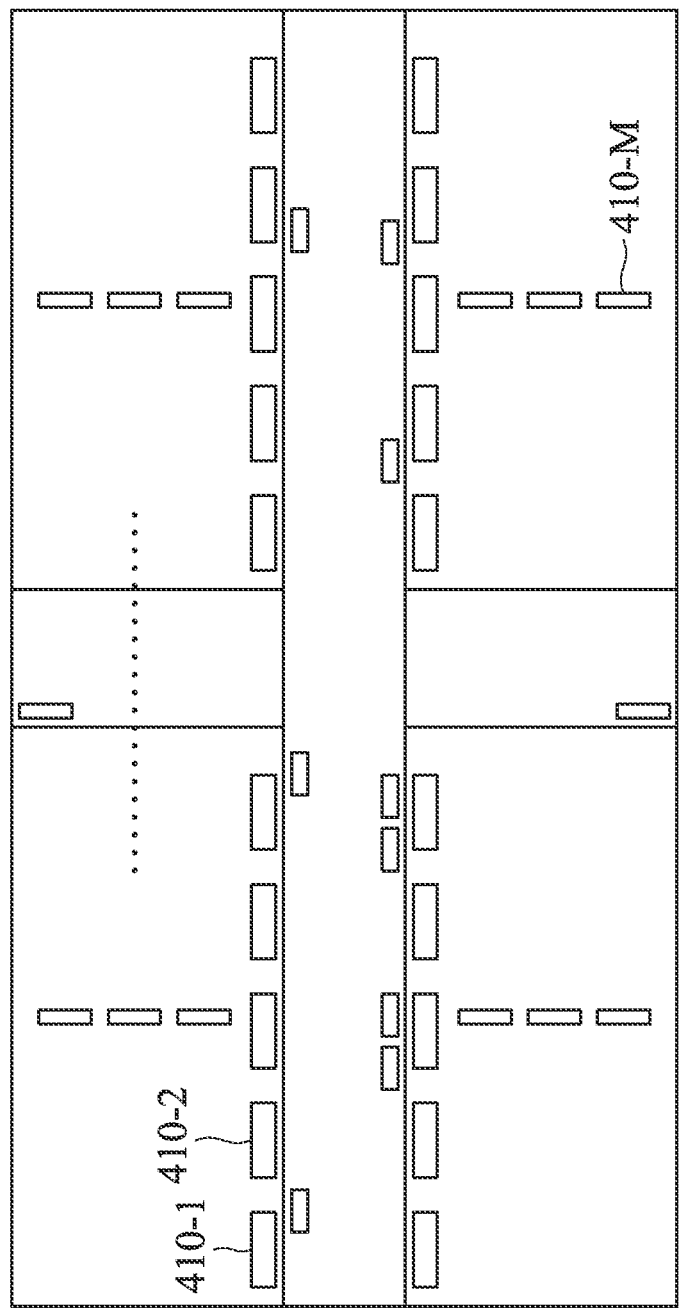
FIG. 4 is a diagram of a conventional memory device.

As shown in FIG. 4, in a conventional memory device 400, a plurality of fuse block units 410-1, 410-2, . . . , and 410-M are arranged in a dispersed manner, and each laser fuse must be coupled to a dedicated flip-flop, thereby occupying large area. On the other hand, the arrangement directions of these fuse block units 410-1, 410-2, . . . , and 410-M are inconsistent with each other. If the conventional memory device 400 is tested, the scanning method of laser beams should be changed many times according to the positions and arrangement directions of the fuse block units 410-1, 410-2, . . . , and 410-M. It takes up a lot of testing time, and increases the overall cost of manufacturing.

Figure 5:
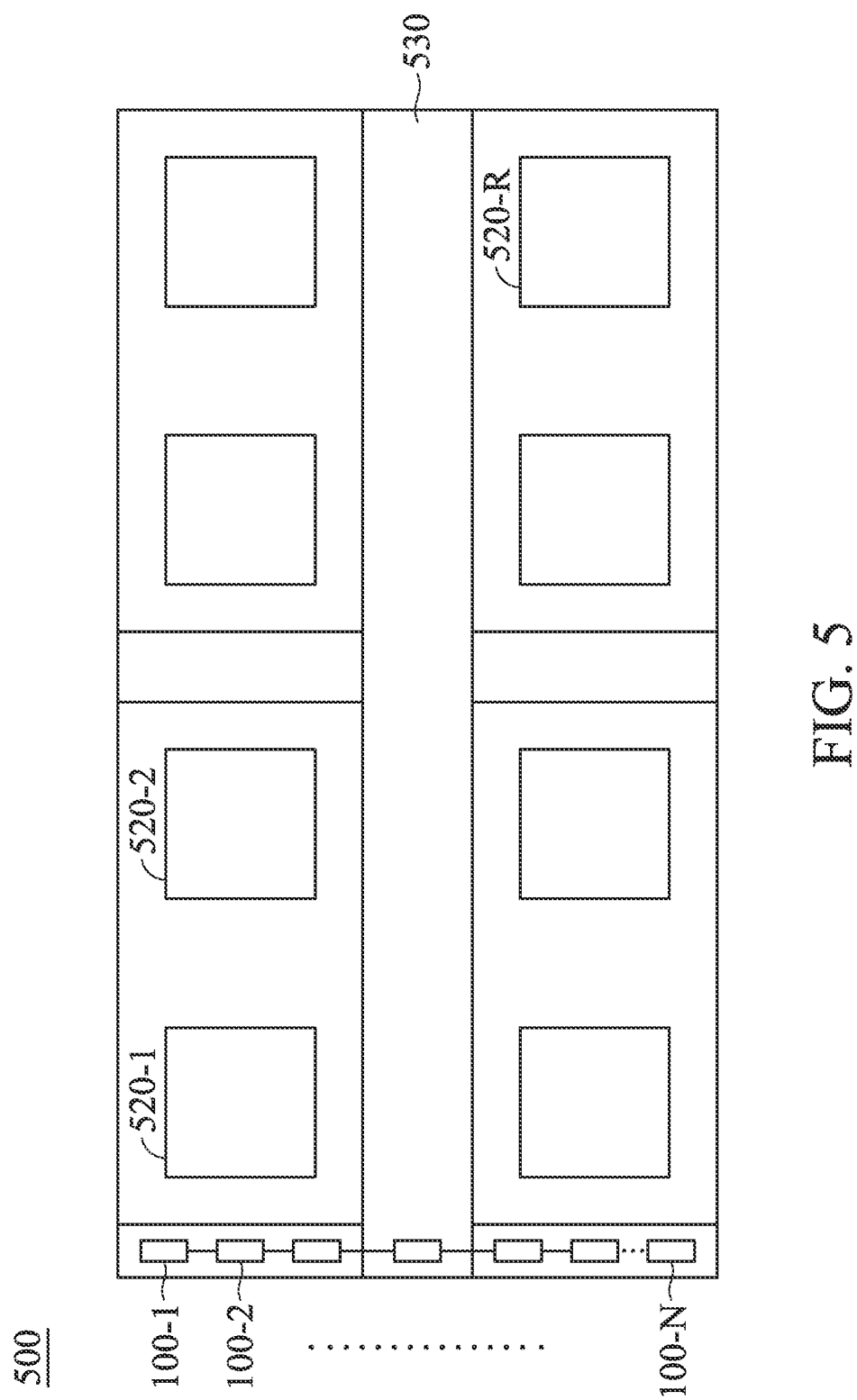
FIG. 5 is a diagram of a memory device according to an embodiment of the invention.

As show in FIG. 5, a memory device 500 includes a plurality of fuse block units 100-1, 100-2, . . . , and 100-N, a plurality of memory banks 520-1, 520-2, . . . , and 520-R (e.g., "R" may be a positive integer which is greater than or equal to 2), and a peripheral circuit 530 according to an embodiment of the invention. The memory banks 520-1, 520-2, . . . , and 520-R and the peripheral circuit 530 can be directly or indirectly controlled by the fuse block units 100-1, 100-2, . . . , and 100-N. It should be noted that the fuse block units 100-1, 100-2, . . . , and 100-N may be substantially arranged in a straight line. Therefore, the total area of these fuse block units can be minimized to make it easier to lay out the wiring, and the number of required tests and the manufacturing cost of the memory device 500 can also be reduced. Other features of the memory device 500 of FIG. 5 are similar to those of the fuse block system 300 of FIG. 3. Therefore, the two embodiments can achieve similar levels of performance.

Figure 6:
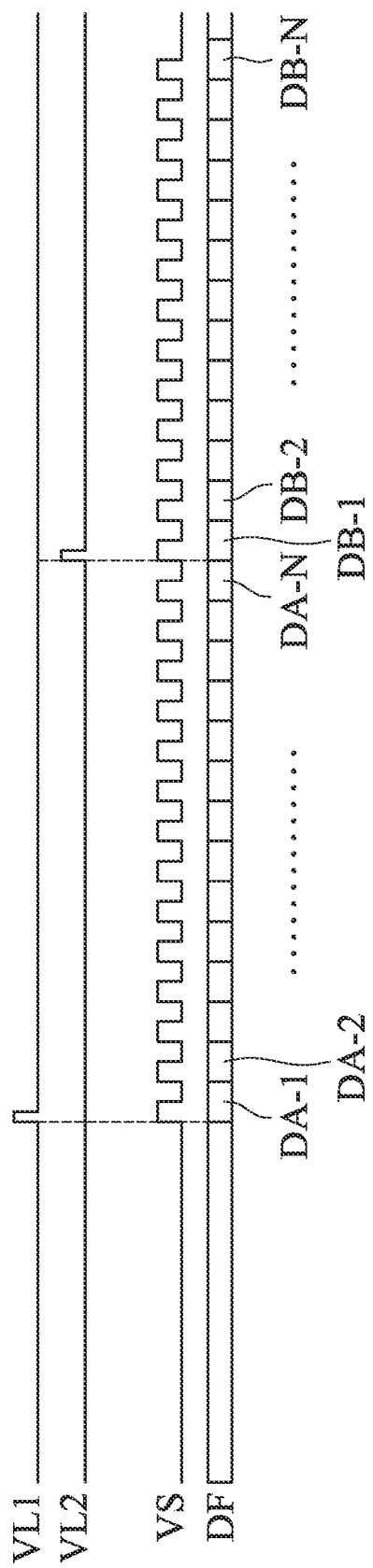
FIG. 6 is a diagram of signaling waveforms of a fuse block system according to an embodiment of the invention.

FIG. 6 is a diagram of signaling waveforms of a control method of the fuse block system 300 according to an embodiment of the invention. Please refer to FIG. 3 and FIG. 6 together. In response to a high logic pulse of the first load voltage VL1, the share flip-flops 130-1, 130-2, . . . , and 130-N can load a plurality of first data DA-1, DA-2, . . . , and DA-N in parallel. In response to a plurality of clocks of the shift voltage VS, the first data DA-1, DA-2, . . . , and DA-N can be output one after another, so as to form the final output data DF. Next, in response to a high logic pulse of the second load voltage VL2, the share flip-flops 130-1, 130-2, . . . , and 130-N can load a plurality of second data DB-1, DB-2, . . . , and DB-N in parallel. In response to the plurality of clocks of the shift voltage VS, the second data DB-1, DB-2, . . . , and DB-N can be output one after another, so as to form the final output data DF. According to such a parallel-input and serial-output design, the number of connection lines of the fuse block system 300 applied to any memory device can be reduced, and it can help to minimize the size of the memory device.

Figure 7:
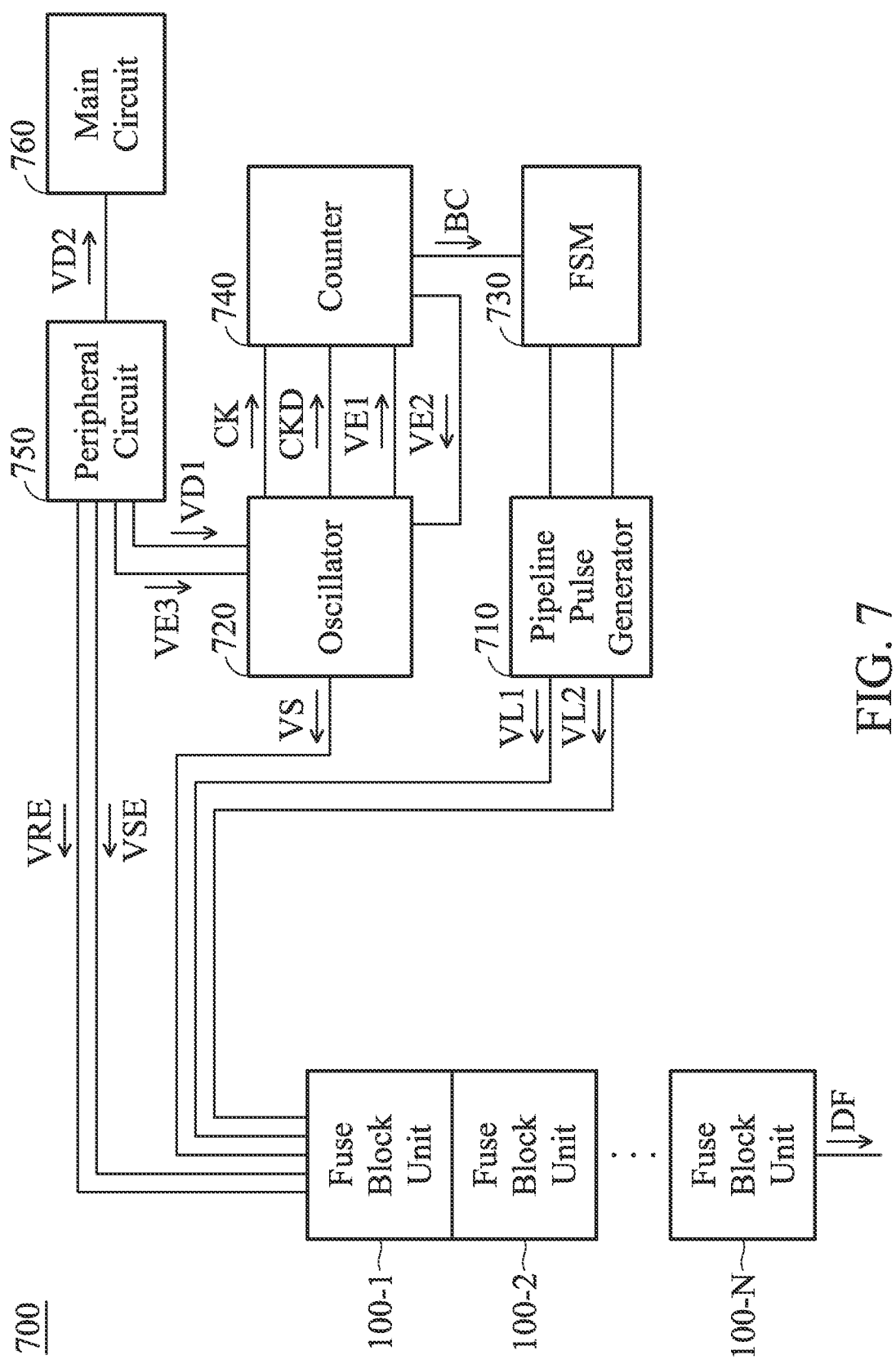
FIG. 7 is a diagram of a memory device according to an embodiment of the invention.

In the embodiment of FIG. 7, a memory device 700 includes a plurality of fuse block units 100-1, 100-2, . . . , and 100-N, a pipeline pulse generator 710, an oscillator 720, an FSM (Finite State Machine) 730, a counter 740, a peripheral circuit 750, and a main circuit 760.

The circuit structures of the fuse block units 100-1, 100-2, . . . , and 100-N have been described in the embodiments of FIG. 1 and FIG. 2. The fuse block units 100-1, 100-2, . . . , and 100-N are coupled in series, and they are operated according to the first load voltage VL1, the second load voltage VL2, and the shift voltage VS, so as to generate final output data DF. In addition, the fuse block units 100-1, 100-2, . . . , and 100-N may be selectively set or reset according to a set voltage VSE and a reset voltage VRE.

Specifically, the peripheral circuit 750 may include a latch control circuit, an oscillator enable circuit, a ready-latching latch circuit, and the like. The latch control circuit is coupled to the laser latches of the fuse block units 100-1, 100-2, . . . , and 100-N, and is configured to generate the set voltage VSE and the reset voltage VRE for setting and resetting these laser latches. The oscillator enable circuit is coupled to the oscillator 720, and is configured to generate a third enable voltage VE3 for selectively enabling the oscillator 720. The ready-latching latch circuit is coupled to the oscillator 720, and is configured to generate a first ready voltage VD1 indicating that the fuse data in the laser latches are ready. The peripheral circuit 750 further includes a second ready voltage generator circuit coupled to the main circuit 760. A second ready voltage VD2 is used to indicate whether the fuse block units 100-1, 100-2, . . . , and 100-N are ready. The main circuit 760 receives the second ready voltage VD2.

The FSM 730 controls the pipeline pulse generator 710 according to a plurality of bits BC. The pipeline pulse generator 710 generates the first load voltage VL1 and the second load voltage VL2 at different times according to the control of the FSM 730. In some embodiments, the FSM 730 includes a decoder and a plurality of flip-flops.

The oscillator 720 generates the shift voltage VS, a base clock CK, a divided clock CKD, and a first enable voltage VE1 according to a second enable voltage VE2, the third enable voltage VE3, and the first ready voltage VD1. The first enable voltage VE1 is configured to selectively enable the counter 740.

The counter 740 generates the bits BC and the second enable voltage VE2 according to the base clock CK, the divided clock CKD, and the first enable voltage VE1. The second enable voltage VE2 is configured to selectively enable the share flip-flops for generating a plurality of clocks. For example, the frequency of the divided clock CKD may be a half of that of the base clock CK, and the total number of bits BC may be equal to 8.

Figure 8:
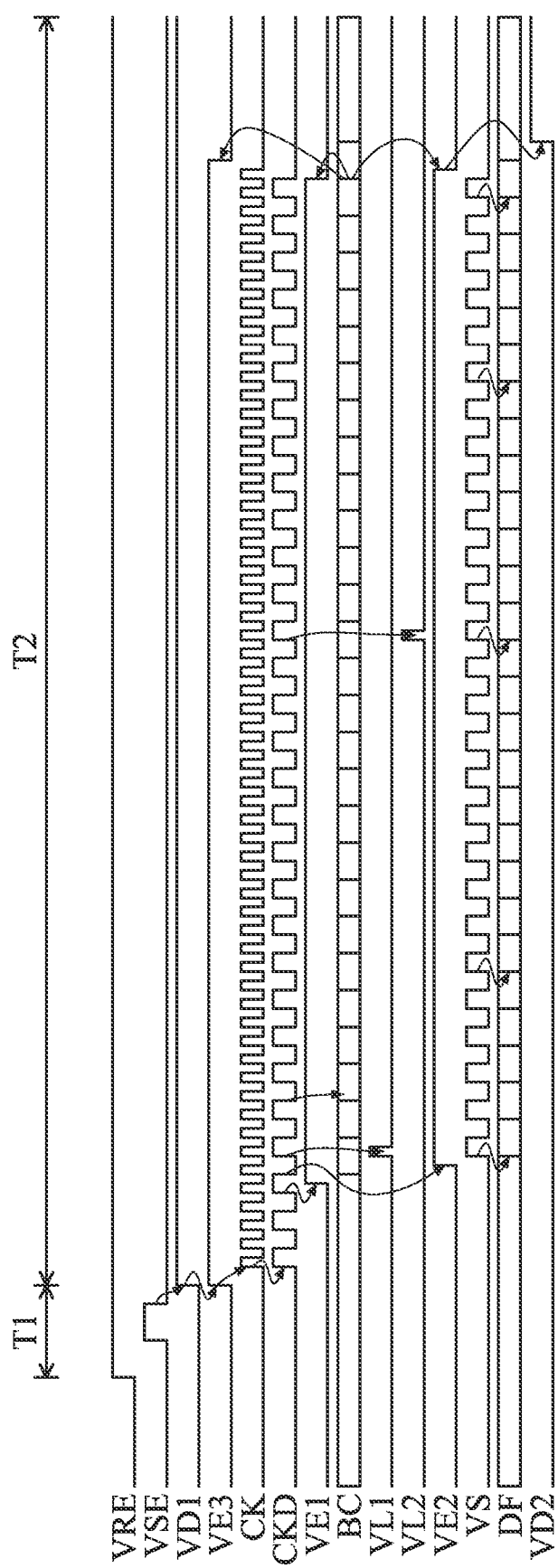
FIG. 8 is a diagram of signaling waveforms of a memory device according to an embodiment of the invention.

FIG. 8 is a diagram of signaling waveforms of an operational method of the memory device 700 according to an embodiment of the invention. In the embodiment of FIG. 8, within a first time interval T1, the latch control circuit generates the set voltage VSE with a high logic pulse after the reset voltage VRE is switched from a low logic level to a high logic level, such that the data in the laser fuses are stored into the corresponding laser latches. Next, within a second time interval T2, the first ready voltage VD1 and the third enable voltage VE3 are switched from low logic levels to high logic levels in respond to the set voltage VSE with the high logic pulse. Thus, the oscillator 720 generates the base clock CK, the divided clock CKD, and the first enable voltage VE1. Then, the counter 740 generates the bits BC and the second enable voltage VE2 according to the base clock CK, the divided clock CKD, and the first enable voltage VE1. Finally, the FSM 730 controls the pipeline pulse generator 710 according to the bits BC, so as to sequentially generate the high logic pulse of the first load voltage VL1 and the high logic pulse of the second load voltage VL2. Therefore, the data are loaded into the share flip-flops of the fuse block units 100-1, 100-2, ..., and 100-N in parallel. After the second time interval T2, the final output data DF will be sequentially output from the aforementioned share flip-flops.

The invention provides a novel fuse block unit, a novel fuse block system, and a novel memory device. Generally, the invention has at least the advantages of increasing the efficiency of its usage of space, decreasing the number of traces, shortening the testing time, and reducing the overall cost of manufacturing, and it is suitable for application in a variety of electronic devices.

It should be noted that the above parameters are not limitations of the invention. A designer can adjust these settings to meet different requirements. The fuse block unit, the fuse block system, and the memory device of the invention are not limited to the configurations illustrated in FIGS. 1-8. The invention may merely include any one or more features of any one or more embodiments of FIGS. 1-8. In other words, not all of the features displayed in the figures should be implemented in the fuse block unit, the fuse block system, and the memory device of the invention. Although the embodiments of the invention use MOSFET as examples, the invention is not limited thereto, and those skilled in the art may use other types of transistors, such as BJT (Bipolar Junction Transistor), JFET (Junction Gate Field Effect Transistor), FinFET (Fin Field Effect Transistor), etc., without affecting the performance of the invention.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. A fuse block unit, comprising:
a first laser fuse, outputting first data;
a first laser latch, coupled to the first laser fuse;
a second laser fuse, outputting second data;
a second laser latch, coupled to the second laser fuse; and
a share flip-flop, comprising:
a first switch element, selectively coupling the first laser latch to a first node according to a first load voltage;
a second switch element, selectively coupling the second laser latch to the first node according to a second load voltage, wherein high logic pulses of the second load voltage do not occur simultaneously with those of the first load voltage;
a third switch element, selectively coupling an input node to the first node according to an inverted shift voltage;
a first latch, coupled between the first node and a second node;
a fourth switch element, selectively coupling the second node to a third node according to a shift voltage; and
a second latch, coupled between the third node and an output node.

2. The fuse block unit as claimed in claim 1, wherein each of the first switch element, the second switch element, the third switch element, and the fourth switch element is implemented with a transmission gate.

3. The fuse block unit as claimed in claim 1, wherein the first switch element comprises:
a first N-type transistor, wherein the first N-type transistor has a control terminal for receiving the first load voltage, a first terminal coupled to the first laser latch, and a second terminal coupled to the first node; and
a first P-type transistor, wherein the first P-type transistor has a control terminal for receiving an inverted first load voltage, a first terminal coupled to the first laser latch, and a second terminal coupled to the first node.

4. The fuse block unit as claimed in claim 1, wherein the second switch element comprises:
a second N-type transistor, wherein the second N-type transistor has a control terminal for receiving the second load voltage, a first terminal coupled to the second laser latch, and a second terminal coupled to the first node; and
a second P-type transistor, wherein the second P-type transistor has a control terminal for receiving an inverted second load voltage, a first terminal coupled to the second laser latch, and a second terminal coupled to the first node.

5. The fuse block unit as claimed in claim 1, wherein the third switch element comprises:
a third N-type transistor, wherein the third N-type transistor has a control terminal for receiving the inverted shift voltage, a first terminal coupled to the input node, and a second terminal coupled to the first node; and
a third P-type transistor, wherein the third P-type transistor has a control terminal for receiving the shift voltage, a first terminal coupled to the input node, and a second terminal coupled to the first node.

6. The fuse block unit as claimed in claim 1, wherein the first latch comprises:
a first inverter, wherein the first inverter has an input terminal coupled to the first node, and an output terminal coupled to the second node; and
a second inverter, wherein the second inverter has an input terminal coupled to the second node, and an output terminal coupled to the first node.

7. The fuse block unit as claimed in claim 1, wherein the fourth switch element comprises:
a fourth N-type transistor, wherein the fourth N-type transistor has a control terminal for receiving the shift voltage, a first terminal coupled to the second node, and a second terminal coupled to the third node; and
a fourth P-type transistor, wherein the fourth P-type transistor has a control terminal for receiving the inverted shift voltage, a first terminal coupled to the second node, and a second terminal coupled to the third node.

8. The fuse block unit as claimed in claim 1, wherein the second latch comprises:
a third inverter, wherein the third inverter has an input terminal coupled to the third node, and an output terminal coupled to the output node; and a fourth inverter, wherein the fourth inverter has an input terminal coupled to the output node, and an output terminal coupled to the third node.

9. A fuse block system, comprising:
a plurality of fuse block units as claimed in claim 1;
wherein a plurality of share flip-flops of the fuse block units are coupled in series.

10. The fuse block system as claimed in claim 9, wherein the fuse block units are substantially arranged in a same straight line.

11. The fuse block system as claimed in claim 9, wherein the share flip-flops receive the first data or the second data simultaneously.

12. The fuse block system as claimed in claim 9, wherein the share flip-flops output the first data and the second data sequentially.

13. A memory device, comprising:
a plurality of fuse block units as claimed in claim 1, wherein the fuse block units are coupled in series, and wherein the fuse block units are operated according to the first load voltage, the second load voltage, and the shift voltage, so as to generate final output data at the output node;
a pipeline pulse generator, generating the first load voltage and the second load voltage; and
an oscillator, generating the shift voltage.

14. The memory device as claimed in claim 13, wherein the fuse block units are substantially arranged in a same straight line.

15. The memory device as claimed in claim 13, further comprising:
an FSM (Finite State Machine), controlling the pipeline pulse generator according to a plurality of bits.

16. The memory device as claimed in claim 15, further comprising:
a counter, generating the bits and a second enable voltage according to a base clock, a divided clock, and a first enable voltage.

17. The memory device as claimed in claim 16, wherein the oscillator further generates the shift voltage, the base clock, the divided clock, and the first enable voltage according to the second enable voltage, a third enable voltage, and a first ready voltage.

18. The memory device as claimed in claim 17, further comprising:
a peripheral circuit, generating a set voltage, a reset voltage, the third enable voltage, the first ready voltage, and a second ready voltage.

19. The memory device as claimed in claim 18, wherein the fuse block units are selectively set or reset according to the set voltage and the reset voltage.

20. The memory device as claimed in claim 18, further comprising:
a main circuit, receiving the second ready voltage.

* * * * *